(12) United States Patent
Gupta et al.

(10) Patent No.: US 7,683,347 B2
(45) Date of Patent: Mar. 23, 2010

(54) TECHNIQUE FOR IMPROVING ION IMPLANTATION THROUGHPUT AND DOSE UNIFORMITY

(75) Inventors: Atul Gupta, Beverly, MA (US); Anthony Renau, West Newbury, MA (US); Donna Smatlak, Belmont, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 672 days.

(21) Appl. No.: 11/537,050

(22) Filed: Sep. 29, 2006

(65) Prior Publication Data

US 2008/0078953 A1   Apr. 3, 2008

(51) Int. Cl.
*H01J 37/317* (2006.01)
*H01L 21/265* (2006.01)

(52) U.S. Cl. ................................. 250/492.21
(58) Field of Classification Search .............. 250/423 R, 250/492.21, 491.1
See application file for complete search history.

(56) References Cited

U.S. PATENT DOCUMENTS

| | | | | |
|---|---|---|---|---|
| 4,449,051 A * | 5/1984 | Berkowitz | ................ | 250/492.2 |
| 4,631,741 A * | 12/1986 | Rand et al. | .................... | 378/10 |
| 5,311,028 A * | 5/1994 | Glavish | .................. | 250/492.21 |
| 5,393,984 A * | 2/1995 | Glavish | ................ | 250/396 ML |
| 5,483,077 A * | 1/1996 | Glavish | .................... | 250/492.2 |
| 6,323,497 B1 * | 11/2001 | Walther | ................... | 250/492.21 |
| 7,253,423 B2 * | 8/2007 | Chang et al. | ............ | 250/492.21 |
| 7,355,188 B2 * | 4/2008 | Olson et al. | ............ | 250/492.21 |
| 2002/0003215 A1 | 1/2002 | Berrian | | |
| 2002/0134948 A1 | 9/2002 | Olson et al. | | |
| 2003/0205679 A1 * | 11/2003 | Benveniste | .............. | 250/423 R |
| 2004/0232350 A1 | 11/2004 | Iwasawa et al. | | |
| 2005/0184254 A1 * | 8/2005 | Matsumoto et al. | .... | 250/492.21 |
| 2005/0258379 A1 | 11/2005 | Renau et al. | | |
| 2006/0057303 A1 * | 3/2006 | Agarwal et al. | ............. | 427/523 |
| 2006/0145095 A1 | 7/2006 | Olson et al. | | |

FOREIGN PATENT DOCUMENTS

| | | | |
|---|---|---|---|
| GB | 2389958 A | 12/2003 | |
| WO | 2001073815 A | 10/2001 | |
| WO | 2002023584 A | 3/2002 | |

\* cited by examiner

OTHER PUBLICATIONS

Scheuer, J.T., et al.; "VIISTa 810 Dosimetry Performance"; Ion Implantation Technology; 2000 Conference on Sep. 17-22, 2000; Piscataway, NJ, USA, IEEE, Sep. 17, 2000, pp. 615-618.

*Primary Examiner*—David A Vanore
*Assistant Examiner*—Johnnie L Smith (57) ABSTRACT

A technique for improving ion implantation throughput and dose uniformity is disclosed. In one exemplary embodiment, a method for improving ion implantation throughput and dose uniformity may comprise measuring an ion beam density distribution in an ion beam. The method may also comprise calculating an ion dose distribution across a predetermined region of a workpiece that results from a scan velocity profile, wherein the scan velocity profile comprises a first component and a second component that control a relative movement between the ion beam and the workpiece in a first direction and a second direction respectively, and wherein the ion dose distribution is based at least in part on the ion beam density distribution. The method may further comprise adjusting at least one of the first component and the second component of the scan velocity profile to achieve a desired ion dose distribution in the predetermined region of the workpiece.

49 Claims, 7 Drawing Sheets

TECHNIQUE FOR IMPROVING ION IMPLANTATION THROUGHPUT AND DOSE UNIFORMITY

FIELD OF THE DISCLOSURE

The present disclosure relates generally to ion implantation and, more particularly, to a technique for improving ion implantation throughput and dose uniformity.

BACKGROUND OF THE DISCLOSURE

Ion implantation is a process of depositing chemical species into a substrate by direct bombardment of the substrate with energized ions. In semiconductor fabrication, ion implanters are used primarily for doping processes that alter the type and level of conductivity of target materials. A precise doping profile in an integrated circuit (IC) substrate is often crucial for proper IC performance. To achieve a desired doping profile, one or more ion species may be implanted in different doses, at different energies and different incident angles.

In production ion implanters, an ion beam is typically of a smaller size than a target wafer, which necessitates either scanning of the ion beam, scanning of the wafer, or a combination thereof. Scanning an ion beam typically refers to movement of the ion beam to increase wafer area that can be implanted, while scanning a wafer typically refers to the relative movement of a wafer through an ion beam. As used hereinafter, "scanning" refers to the relative movement of an ion beam with respect to a wafer or substrate surface. The ion beam is typically either a "ribbon beam" having a rectangular cross section or a "spot beam" having an approximately circular or elliptical cross section. For purpose of the present disclosure, a ribbon beam may be either a static ribbon beam or a scanned ribbon beam which is created by scanning a spot beam at a high frequency. In the case of a ribbon beam with a dimension larger than the wafer diameter, ion implantation of the wafer may be achieved by keeping the ribbon beam stationary and simultaneously moving the wafer across the ribbon beam in a direction orthogonal to the longer dimension of the ribbon beam. The one-dimensional (1-D) movement of the wafer may cause the ribbon beam to cover the entire wafer surface. In the case of a spot beam, scanning of a wafer may be achieved by sweeping the spot beam back and forth between two endpoints to form a scan path and by simultaneously moving the wafer across the scan path.

Sweeping of an ion beam may be accomplished through the use of electrostatic scanners or magnetic scanners, wherein the ion beam is controllably deflected from its normal trajectory to span a larger area by changing the electric or magnetic fields respectively in a direction orthogonal to the direction of travel of the ion beam. The strength of the scanner field determines the total deflection from the normal path of the ion beam, hence the ion beam may be scanned by changing the field strength of the scanner elements. The movement of the wafer across the scan path may be either continuous or incremental.

During ion implantation, it is desirable to achieve a uniform ion dose or beam current profile along the scan path. The process of tuning the ion implanter system to achieve the uniform ion dose or beam current profile is called "uniformity tuning." Existing uniformity tuning techniques typically follow one of three approaches.

A first approach is to scan a spot beam across a wafer plane while moving the target wafer through the scan path at a constant velocity. In this first approach, improvement of dose uniformity is achieved by only tuning a beam scan velocity profile. Since the beam current distribution within the spot beam typically has a Gaussian-like non-uniform profile, it is often necessary to scan the spot beam off the wafer edges in order to avoid current fall-off at either end of the scan path. As a result, a significant fraction of the available beam current is lost due to overscan of the ion beam.

A second approach is to scan a target wafer through a stationary ion beam. If the ion beam cross section is smaller than the wafer diameter, the wafer is scanned in two directions with constant velocity in one direction and a step size in the other direction. This approach is known in the art as "2-D mechanical scan." In this second approach, the wafer requires multiple passes in the first direction through the ion beam, and an optimized step size in the second (orthogonal) direction, which causes the ion implanter to operate at a low throughput. In addition, since the ion beam is typically non-uniform, the best possible uniformity achieved with the second approach is limited by the step size between the passes and the velocity in the first direction.

A third approach is to have a stationary ribbon beam that spans a distance larger than the wafer diameter, such that the wafer may be scanned across the ribbon beam to get a desired dose. The desired dose uniformity on the wafer is limited by the uniformity of the ion beam density distribution in the ribbon beam since the wafer is typically scanned at constant velocity. However, tuning the ribbon beam for a desired uniformity may be cumbersome and time consuming, thus may negatively impact the ion implanter's throughput.

In view of the foregoing, it would be desirable to provide a technique for improving ion implantation throughput and dose uniformity which overcomes the above-described inadequacies and shortcomings.

SUMMARY OF THE DISCLOSURE

A technique for improving ion implantation throughput and dose uniformity is disclosed. In one particular exemplary embodiment, the technique may be realized as a method for improving ion implantation throughput and dose uniformity. The method may comprise measuring an ion beam density distribution in an ion beam. The method may also comprise calculating an ion dose distribution across a predetermined region of a workpiece that results from a scan velocity profile, wherein the scan velocity profile comprises a first component and a second component that control a relative movement between the ion beam and the workpiece in a first direction and a second direction respectively, and wherein the ion dose distribution is based at least in part on the ion beam density distribution. The method may further comprise adjusting at least one of the first component and the second component of the scan velocity profile to achieve a desired ion dose distribution in the predetermined region of the workpiece.

In accordance with other aspects of this particular exemplary embodiment, the first direction may be a beam scan direction, and the first component may be a beam scan velocity profile. The second direction may be a wafer scan direction, and the second component may be a wafer scan velocity profile.

In accordance with further aspects of this particular exemplary embodiment, the method may further comprise performing ion implantation according to the adjusted scan velocity profile.

In accordance with additional aspects of this particular exemplary embodiment, the desired ion dose distribution may comprise a uniform distribution pattern in the predetermined region. Alternatively, the desired ion dose distribution may comprise a radial distribution pattern in the predetermined region. Or, the desired ion dose distribution may comprise a distribution pattern in the predetermined region that is configurable to improve device yield based on process variations during ion implantation.

In accordance with another aspect of this particular exemplary embodiment, the scan velocity profile may further comprise a third component that controls one or more rotations of the workpiece to achieve one or more orientations of the workpiece during ion implantation. At least one of the first component and the second component of the scan velocity profile may be adjusted after at least one rotation of the workpiece. At least one of the first component and the second component of the scan velocity profile may be dynamically adjusted for at least one orientation of the workpiece. The third component may comprise a rotation mode selected from a group consisting of: a single-step mode involving no rotation of the workpiece, a 2-step mode involving two rotations of the workpiece, a quad-mode involving four rotations of the workpiece, and an 8-step mode involving eight rotations of the workpiece. The rotation mode may be selected to improve beam utilization and hence the ion implanter throughput.

In accordance with yet another aspect of this particular exemplary embodiment, the method may further comprise adjusting an ion beam profile over the predetermined region in the first direction and adjusting the second component of the scan velocity profile. The ion beam profile may be adjusted by changing a scan distance of the ion beam in at least one of the first direction and the second direction. The ion beam profile may be adjusted by changing at least one of the first component and the second component of the scan velocity profile. The ion beam profile may be adjusted in at least one of the first direction and the second direction to make the ion beam profile more symmetric with respect to a center of the ion beam profile. The ion beam profile may be adjusted in at least one of the first direction and the second direction to make the ion beam profile more asymmetric with respect to a center of the ion beam profile.

In accordance with still another aspect of this particular exemplary embodiment, the method may further comprise the steps of: selecting a workpiece rotation mode based on whether an ion beam profile in the first direction has a predominantly symmetric or asymmetric component in the first direction; adjusting the first component of the scan velocity profile to further enhance the predominantly symmetric or asymmetric component; and adjusting, based on the adjusted first component and the selected workpiece rotation mode, the second component of the scan velocity profile to achieve the desired ion dose distribution. The method may further comprise selecting a 2-step workpiece rotation mode if the ion beam profile has a predominantly symmetric component, wherein the workpiece is rotated by −90° and +90°. The method may further comprise selecting a 2-step workpiece rotation mode if the ion beam profile has a predominantly asymmetric component, wherein the workpiece is rotated by 180°. Or, the method may further comprise selecting a 4-step workpiece rotation mode if the ion beam profile has a predominantly asymmetric component, wherein the workpiece is rotated by 90° in each step.

In accordance with a further aspect of this particular exemplary embodiment, the first direction may be perpendicular to the second direction.

In accordance with yet a further aspect of this particular exemplary embodiment, the ion beam may be a ribbon beam, and an ion beam profile in the first direction may be adjusted by tuning one or more beamline elements to change a spatial distribution of beamlets within the ribbon beam. Alternatively, the ion beam may be a stationary spot beam, and wherein the scan velocity profile causes a 2-D mechanical scan of the wafer through the stationary spot beam. The first component of the scan velocity profile may cause the wafer to move at a variable speed in the first direction, and the second component of the scan velocity profile may comprise a variable scan pitch.

In another particular exemplary embodiment, the techniques may be realized as at least one signal embodied in at least one carrier wave for transmitting a computer program of instructions configured to be readable by at least one processor for instructing the at least one processor to execute a computer process for performing the method as recited above.

In yet another particular exemplary embodiment, the techniques may be realized as at least one processor readable carrier for storing a computer program of instructions configured to be readable by at least one processor for instructing the at least one processor to execute a computer process for performing the method as recited above.

In still another particular exemplary embodiment, the techniques may be realized as a system for improving ion implantation throughput and dose uniformity. The system may comprise a processor unit in communication with a scan controller of an ion implanter, wherein the scan controller is configured to cause an ion beam to scan across a predetermined region of a workpiece. The system may also comprise a measurement interface coupled to the processor unit and the ion implanter. The processor unit may be adapted to: measure an ion beam density distribution in an ion beam; calculate an ion dose distribution across a predetermined region of a workpiece that results from a scan velocity profile, wherein the scan velocity profile comprises a first component and a second component that control a relative movement between the ion beam and the workpiece in a first direction and a second direction respectively, and wherein the ion dose distribution is based at least in part on the ion beam density distribution; and adjust at least one of the first component and the second component of the scan velocity profile to achieve a desired ion dose distribution in the predetermined region of the workpiece.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure may improve ion implantation throughput and dose uniformity by combining the shaping of an ion beam profile with the tuning of a wafer scan velocity profile. An ion beam to which the technique described herein may be applicable may be either a stationary ion beam or a scanned ion beam. An orthogonal scan compensation (OSC) mode may be chosen based on a symmetry characteristic of the ion beam profile, and a symmetry characteristic of the ion beam profile may be further enhanced for the chosen OSC mode. The OSC technique recognizes the fact that a wafer can be implanted in multiple passes through an ion beam and a rotation of the wafer between passes provides an additional degree of freedom to achieve the desired dose distribution on the wafer. The ion implantation throughput may also be improved by imposing a desired beam utilization value and/or by choosing an OSC mode involving fewer rotation steps.

Figure 1:
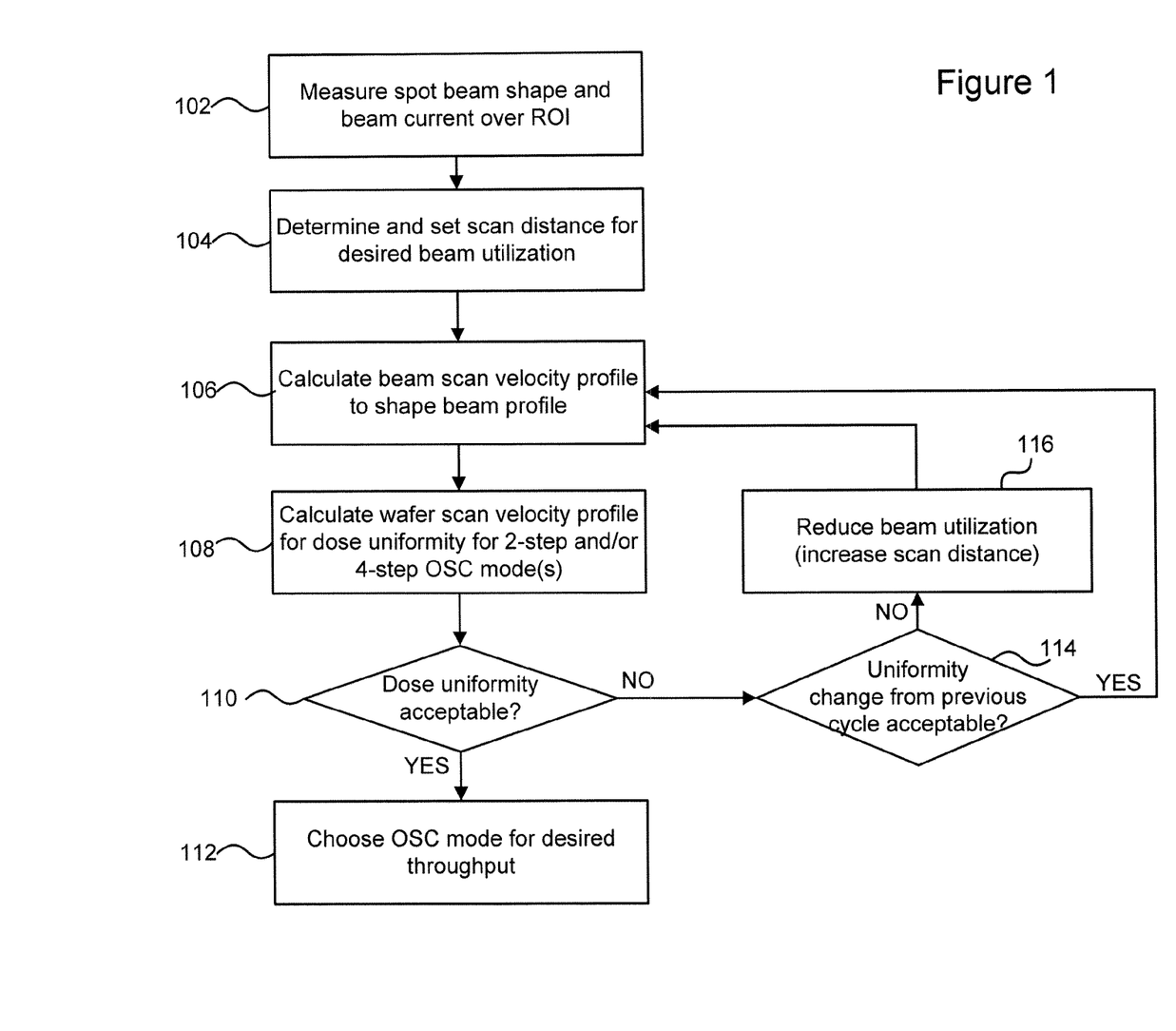
FIG. 1 shows a flowchart illustrating an exemplary method for improving ion implantation throughput and dose uniformity in accordance with an embodiment of the present disclosure.

Referring to FIG. 1, there is shown a flowchart illustrating an exemplary method for improving ion implantation throughput and dose uniformity in accordance with an embodiment of the present disclosure.

Figure 3:
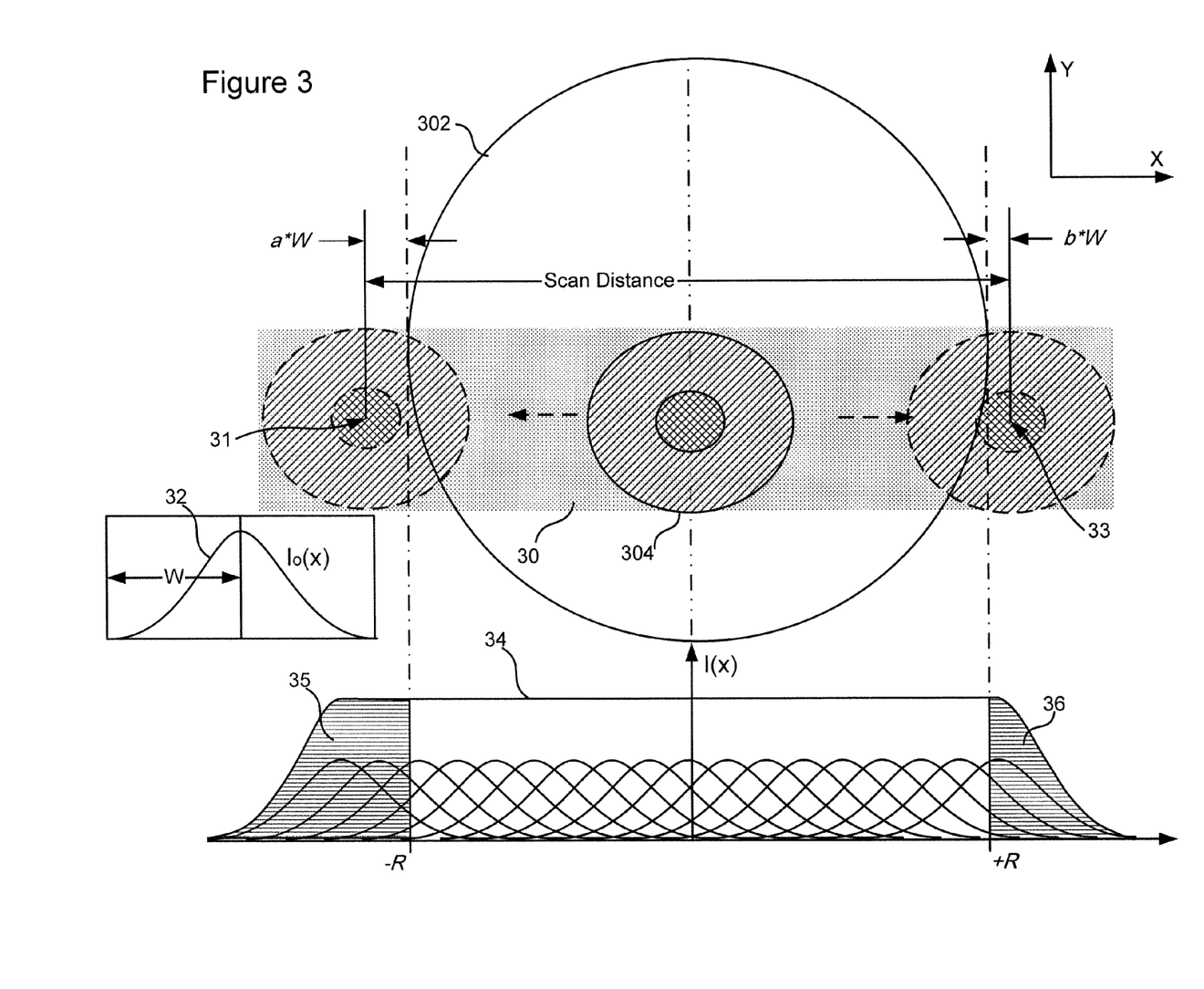
FIG. 3 illustrates ion beam overscan and parameters associated with beam utilization in accordance with an embodiment of the present disclosure.

In step 102, a spot beam may be measured. The measurement may involve measuring a stationary spot beam at a center spot of a region of interest (ROI) or a target wafer. The measurement may also involve measuring a current profile and/or dose profile produced by scanning the spot beam across the ROI. FIG. 3 shows a spot beam 304 being scanned across a target wafer (or ROI) 302 between two endpoints 31 and 32. A scan path 30 may be formed by scanning the spot beam 304 in the ±X directions. The stationary spot beam may have a Gaussian-like non-uniform current or dose distribution, such as a profile 32, which is denoted "$I_0(x)$." As indicated in the profile 32, the spot beam 304 may have a half width of W. The current profile and/or dose profile resulting from the scanned spot beam 304 may be referred to as an "ion beam profile." In FIG. 3, a current profile 34 $I(x)$ is shown.

In step 104, a desired beam utilization value may be set and a scan distance may be determined based on the desired beam utilization value. As shown in FIG. 3, the spot beam 304 may be overscanned, that is, scanned at least partially off the wafer edges (i.e., $x=-R$ and $x=+R$). As a result, a small fraction of the beam current is lost. The ratio between the accumulated beam current on the wafer (i.e., the amount of beam current actually used for ion implantation) and the total beam current accumulated during a full scan is referred to as "beam utilization." Referring to the beam current profile $I(x)$ in FIG. 3, the shadowed area 35 beyond the left edge of the wafer 302 and the shadowed area 36 beyond the right edge represent inside (left) utilization loss and outside (right) utilization loss.

Figure 2:
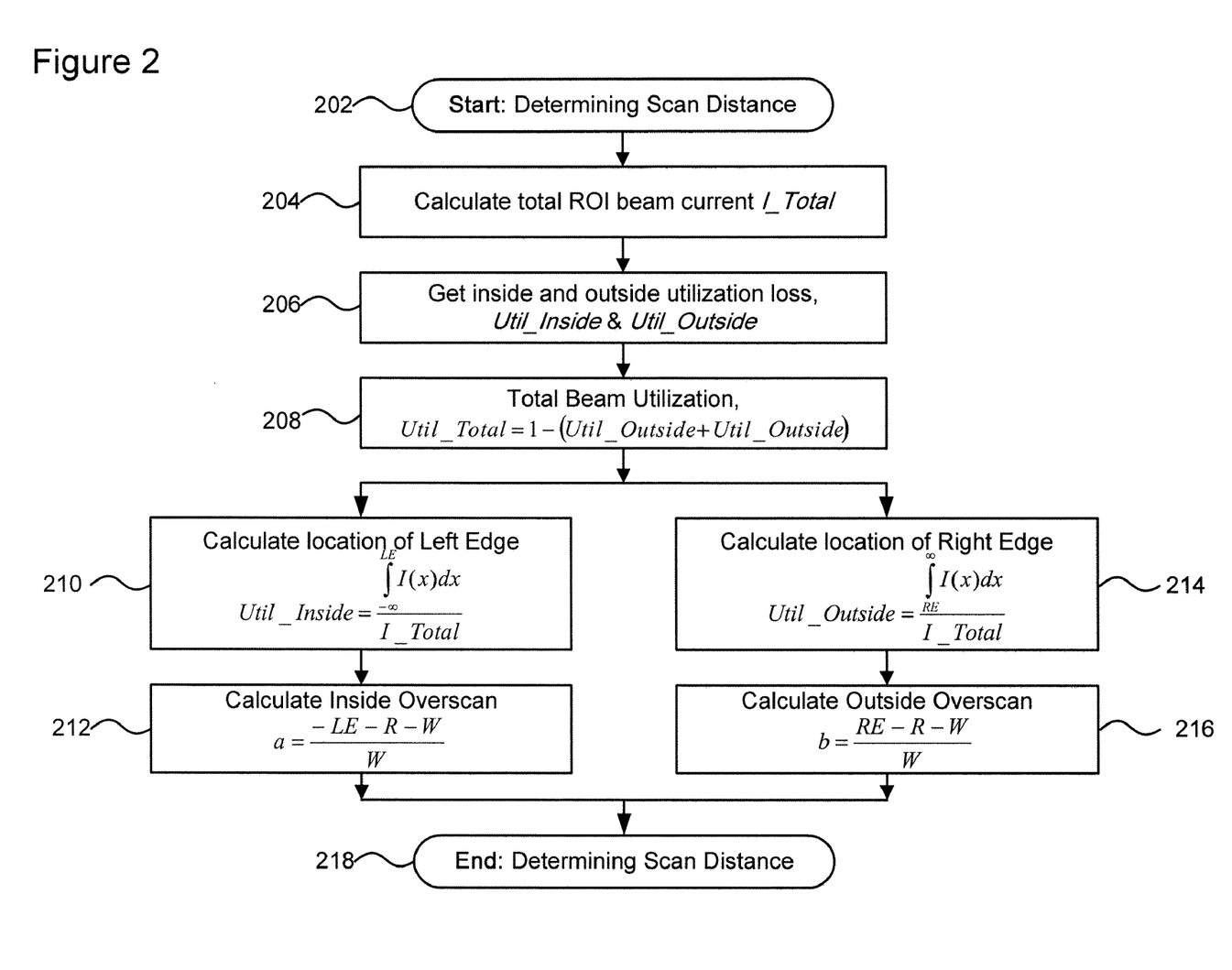
FIG. 2 shows a flowchart illustrating an exemplary process for determining a beam scan distance in accordance with an embodiment of the present disclosure.

FIG. 2 shows a flowchart illustrating an exemplary process for determining a beam scan distance in accordance with an embodiment of the present disclosure. In describing this exemplary process, references will continue to be made to FIG. 3.

In step 202, the process for determining the beam scan distance starts.

In step 204, a total beam current over the ROI, i.e., I_Total, may be calculated based on the beam current profile $I(x)$.

In step 206, an inside utilization loss (Util_Inside) and an outside utilization loss (Util_Outside) may be selected, for example, by an operator of an ion implanter. For maximum beam utilization (and hence highest tool throughput), these losses should ideally be minimized, i.e., set to zero. However in practice, it may be difficult to have 100% beam utilization due to uniformity constraints or other closed loop control requirements.

In step 208, a total beam utilization Util_Total may be calculated as:

Util_Total=1−(Util_Outside+Util_Outside)

In step 210, the location of the left edge of the scanned beam, LE, may be determined based on the following equation:

$$\text{Util\_Inside} = \frac{\int_{-\infty}^{LE} I(x)\,dx}{\text{I\_Total}}$$

In step 212, based on the location of the left edge, the inside overscan may be calculated as:

$$a = \frac{-LE - R - W}{W}$$

Similarly, in step 214, the location of the right edge of the scanned beam, RE, may be determined based on the following equation:

$$\text{Util\_Outside} = \frac{\int_{RE}^{\infty} I(x)\,dx}{\text{I\_Total}}$$

In step 216, based on the location of the right edge, the outside overscan may be calculated as:

$$b = \frac{RE - R - W}{W}$$

The process for determining the scan distance may then end in step 218.

Figure 4:
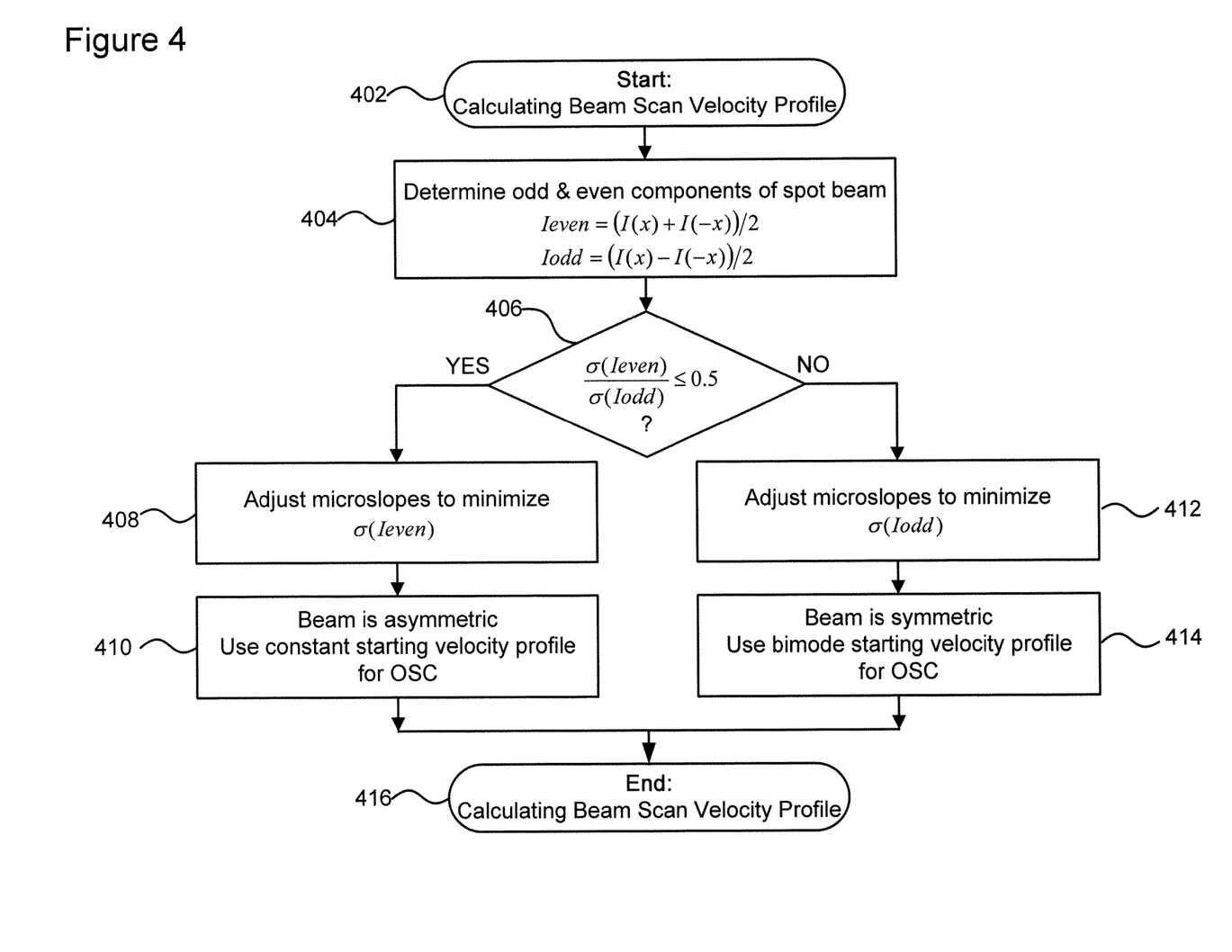
FIG. 4 shows a flowchart illustrating an exemplary process for calculating a beam scan velocity profile in accordance with an embodiment of the present disclosure.

Referring back to FIG. 1, in step 106, a beam scan velocity profile may be calculated to shape the beam current profile $I(x)$. FIG. 4 shows a flowchart illustrating an exemplary process for calculating a beam scan velocity profile in accordance with an embodiment of the present disclosure.

In step 402, the process for calculating beam scan velocity profile starts.

In step 404, odd and even components of the beam current profile I(x) may be determined. The odd component of the beam current profile I(x) may be denoted $I_{odd}(x)$ and the even component may be denoted $I_{even}(X)$, wherein $$Ieven = (I(x) + I(-x))/2$$

$$Iodd = (I(x) - I(-x))/2$$

and wherein $$I(x) = Ieven(x) + Iodd(x)$$

As so defined, $I_{even}(x)$ may represent a symmetric component of the beam current I(x) while $I_{odd}(X)$ may represent an asymmetric component. The symmetric characteristics are with respect to the point x=0. By definition, $I_{even}(x)$ and $I_{odd}(X)$ satisfy the following equations, respectively:

$$Ieven(-x) = Ieven(x)$$

$$Iodd(-x) = -Iodd(x)$$

In step 406, it may be determined whether the beam current profile I(x) has a predominantly symmetric or asymmetric component. One way to make such a determination may be to compare standard deviations, $\sigma(I_{even})$ and $\sigma(I_{odd})$, which are associated with $I_{even}(x)$ and $I_{odd}(x)$ respectively. A user designated threshold value may be used in this comparison. It should be noted that, although a threshold value of 0.5 is used herein, other threshold values may also be chosen.

If it is determined that $$\frac{\sigma(Ieven)}{\sigma(Iodd)} \leq 0.5$$

then, in step 408, the asymmetric feature of the beam current profile may be further enhanced, for example, by minimizing the standard deviation $\sigma(I_{even})$. According to one embodiment of the present disclosure, microslopes in the beam scan velocity profile may be adjusted to minimize $\sigma(I_{even})$. Next, in step 410, it may be decided that the beam profile is predominantly asymmetric and a constant starting velocity profile may be used for orthogonal scan compensation (OSC). This solution for the velocity profile results from the fact that, if the scanned beam profile is completely asymmetric (e.g., a linear variation from one side to another), a 180° rotation between passes through the beam completely balance out the dose variation introduced in each pass. Thus, although the individual passes contribute a non-uniform dose (linearly varying dose) across the wafer, the sum of doses from the two rotations may still be perfectly uniform. Typically, for a predominantly asymmetric beam profile, a two-step OSC mode wherein the wafer is rotated 180° or a four-step OSC mode wherein the wafer is rotated 90° in each step may be chosen.

If it is determined in step 406 that $$\frac{\sigma(Ieven)}{\sigma(Iodd)} > 0.5$$

then, in step 412, the symmetric feature of the beam current profile may be further enhanced, for example, by minimizing the standard deviation $\sigma(I_{odd})$. According to one embodiment of the present disclosure, microslopes in the beam scan velocity profile may be adjusted to minimize $\sigma(I_{odd})$. Next, in step 414, it may be decided that the beam profile is predominantly symmetric and a bi-mode starting velocity profile may be used for orthogonal scan compensation (OSC). That is, a velocity profile that is obtained for a two-step (90° rotation each) OSC mode may be used as a starting point for determining the solution for the four-step OSC mode. The reason for this approach is computational efficiency in finding a numerical solution for the velocity profile from a better initial guess. The bi-mode problem is easier to solve and takes less computation time since there are only two dose maps corresponding to the two steps that are added to obtain the final dose map. Typically, for a predominantly symmetric beam profile, a two-step OSC mode may be used, wherein the wafer is rotated +/−90°, if the desired uniformity can be obtained to improve throughput. Otherwise, a four-step OSC mode will be used.

In step 416, the process for calculating the beam scan velocity profile may end.

Referring back to FIG. 1, in step 108, the above-calculated beam scan velocity profile may be used as an input to calculate a wafer scan velocity profile such that it produces a desired dose uniformity. The wafer scan velocity may be calculated for suitable OSC modes as determined above.

In step 110, it may be determined whether the resulting dose uniformity is acceptable. If so, an OSC mode may be optionally chosen in step 112 based on throughput considerations. For example, where both a two-step and four-step OSC modes are appropriate, it may be beneficial to choose the two-step OSC mode because the fewer steps may lead to a higher throughput in ion implantation.

However, if the resulting uniformity is not acceptable, it may be further determined in step 114 whether the uniformity change from the previous cycle is acceptable. As may be appreciated by those skilled in the art, the step of calculating the beam scan velocity profile and the step of calculating the wafer scan velocity profile may be iterated or recursively repeated in multiple cycles. The uniformity change between two consecutive cycles may be evaluated herein step 114. If the dose uniformity improves (or at least does not deteriorate too much), the process may loop back to step 106 where the microslopes in the beam scan velocity profile may be further adjusted. If the uniformity change is not acceptable, then, in step 116, the beam utilization value may be decreased. That is, the scan distance may need to be increased to afford a better chance of reaching an acceptable dose uniformity after the process subsequently loops back to step 106.

Figure 6:
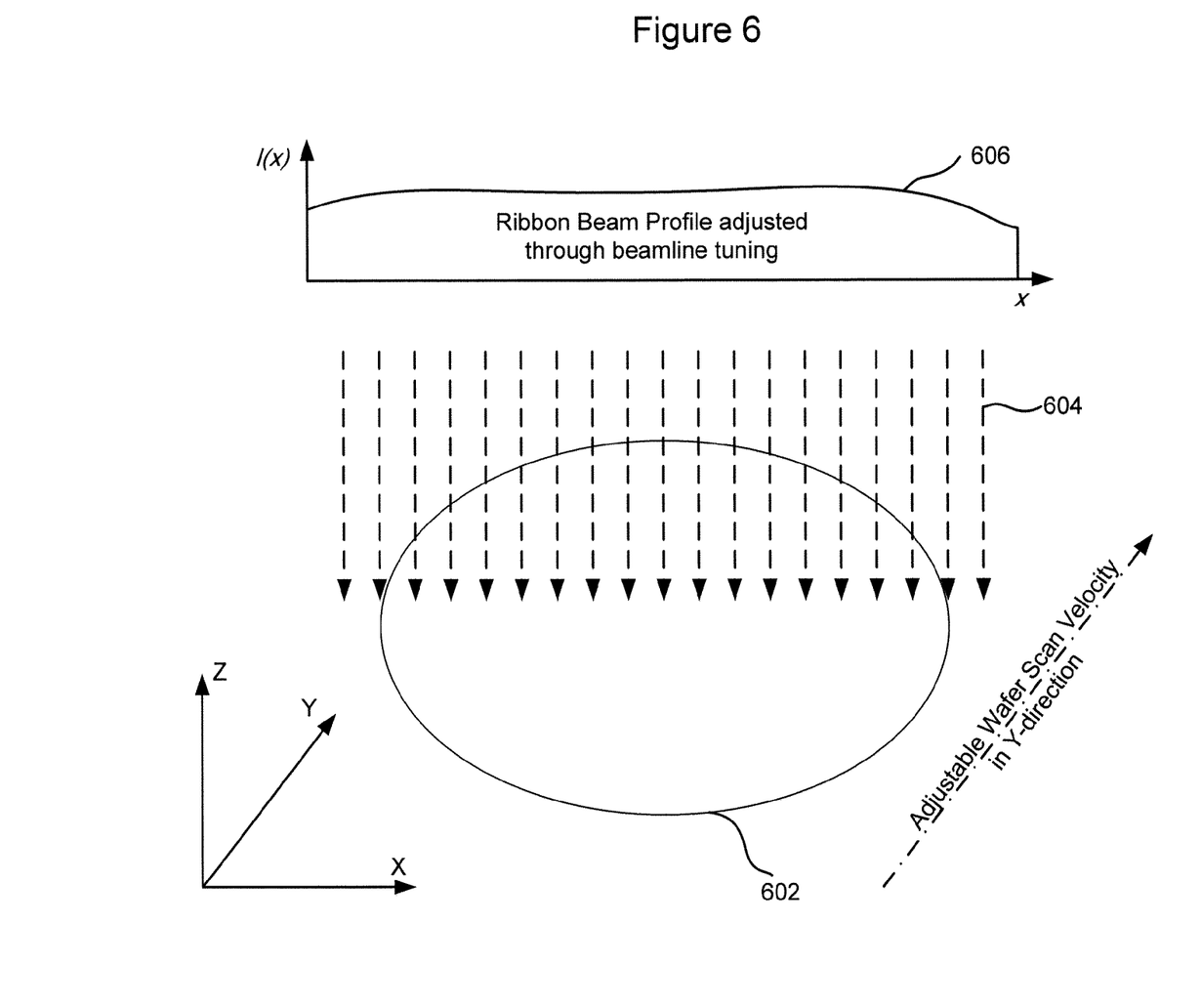
FIG. 6 illustrates an exemplary method for improving ion implantation involving a ribbon beam in accordance with an embodiment of the present disclosure.

Although the exemplary embodiments described so far have focused on a spot beam, it should be noted that the technique for improving ion implantation throughput and dose uniformity in accordance with the present disclosure may also be applied to a ribbon beam in a similar fashion. FIG. 6 illustrates an exemplary method for improving ion implantation involving a ribbon beam 604 in accordance with an embodiment of the present disclosure. For a ribbon beam 604 that is wider than a target wafer 602, it may not be necessary to scan the ribbon beam 604 to produce a beam current or ion dose profile. Instead, the beam current or dose profile may be that of the ribbon beam's intrinsic current or dose distribution, which may be referred to as the ribbon beam profile 606. The process may start with a determination of the ribbon beam profile 606 as it spans the beam width. Then, it may be determined as to whether the ribbon beam profile 606 has a predominantly symmetric or asymmetric component, and, based on this determination, a wafer rotation mode (OSC mode) may be selected. Next, the ribbon beam 604 may be adjusted (e.g., through beamline tuning) to further enhance the predominantly symmetric or asymmetric component. Based on the adjusted ribbon beam and the selected wafer rotation mode, a wafer scan velocity profile may be calculated, such that, when the target wafer 602 is translated (in Y direction) across the ribbon beam according to the wafer scan velocity profile, the ribbon beam 604 would produce an acceptable ion dose uniformity on the target wafer 602.

Figure 7:
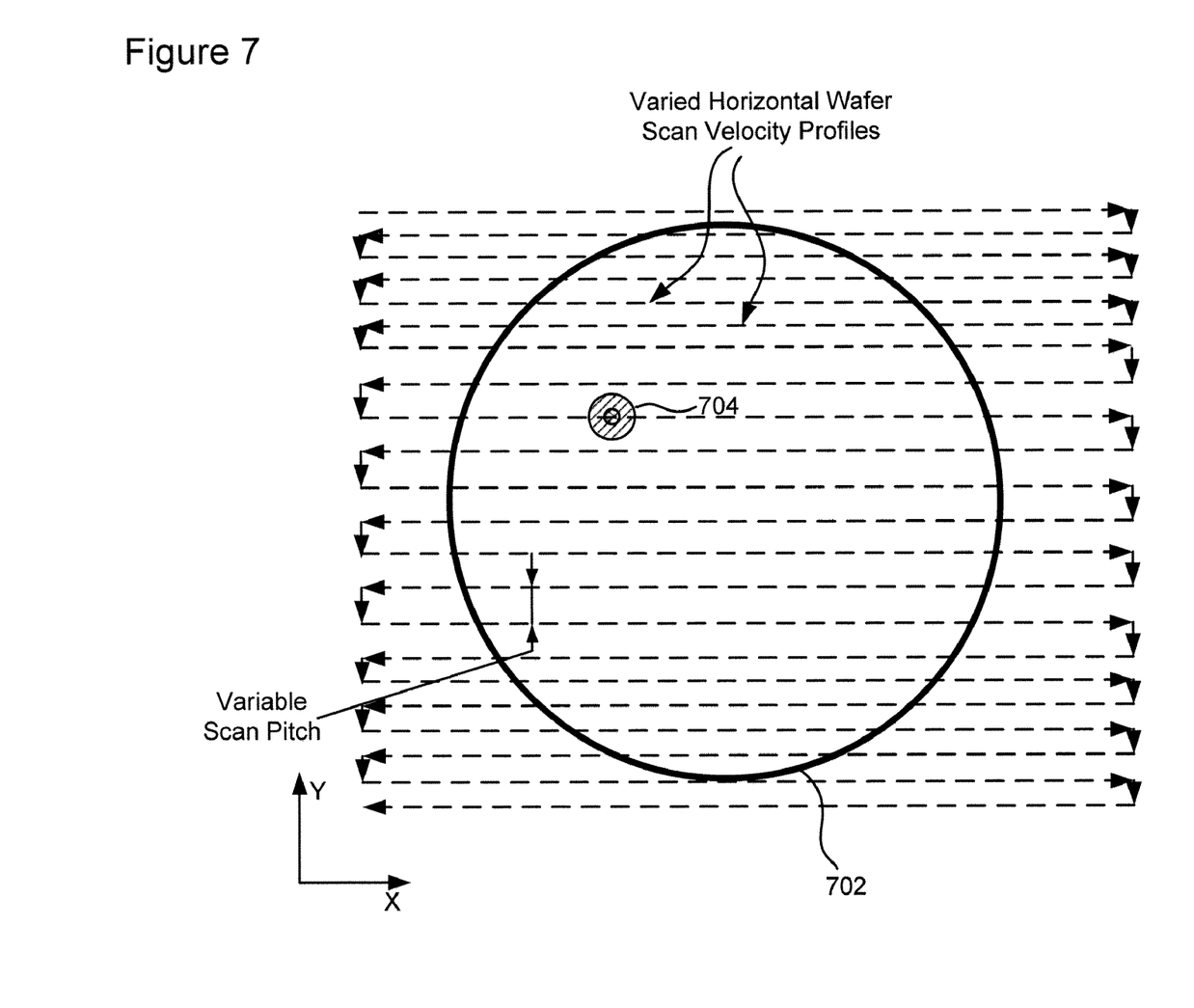
FIG. 7 illustrates an exemplary method for improving ion implantation involving a 2-D mechanical scan of a wafer through a spot beam in accordance with an embodiment of the present disclosure.

FIG. 7 illustrates an exemplary method for improving ion implantation involving a 2-D mechanical scan of a wafer 702 through a spot beam 704 in accordance with an embodiment of the present disclosure. The beam profile in the X and Y directions may both be adjusted through variable wafer scan velocity profiles for a given Y-step (or scan pitch). This approach may especially be useful to eliminate a need for small scan pitches to address a micro-uniformity problem wherein the wafer 702 may show horizontal stripes of dose variation due to a non-optimal scan pitch. A 90° rotation of the wafer 702 between two successive passes may eliminate the need to reduce the scan pitch and may improve dose uniformity across the wafer 702. In addition, the scan pitch may be varied to maximize the throughput.

Figure 5:
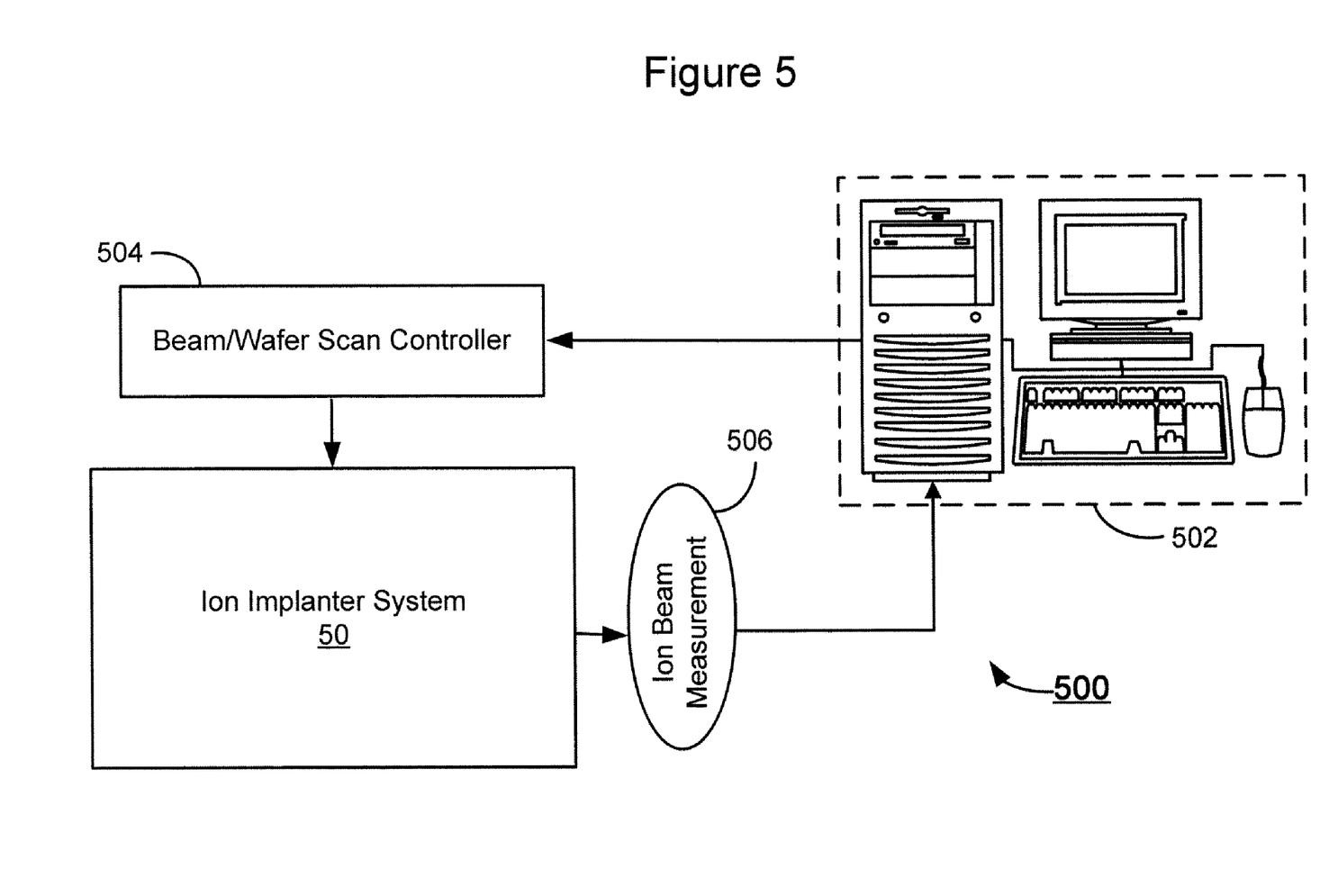
FIG. 5 shows a block diagram illustrating an exemplary system for improving ion implantation throughput and dose uniformity in accordance with an embodiment of the present disclosure.

FIG. 5 shows a block diagram illustrating an exemplary system 500 for improving ion implantation throughput and dose uniformity in accordance with an embodiment of the present disclosure. The system 500 may comprise a processor unit 502 which may be a microprocessor, micro-controller, personal computer (PC) or any other processing device. The system 500 may also comprise a beam/wafer scan controller 504 that is coupled to an ion implanter system 50 and may control the scanning movement of a wafer and/or an ion beam according to instructions received from the processor unit 502. The system 500 may further comprise an ion beam measurement interface 506 through which the processor unit 502 may receive measurement data from the ion implanter system 50.

In operation, the processor unit 502 may cause the beam/wafer scan controller 504 to initiate a preliminary scan in the ion implanter system 50, and may receive ion beam measurements (e.g., ion dose and/or beam current) via the measurement interface 508. The processor unit 502 may also receive user inputs such as, for example, beam utilization, a threshold value for evaluating beam profile, and uniformity criteria. The processor unit 502 may then select a desired OSC mode, calculate a beam scan velocity profile, and tune a wafer scan velocity profile for dose/current uniformity.

At this point it should be noted that the technique for improving ion implantation throughput and dose uniformity in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with uniformity tuning in accordance with the present disclosure as described above. Alternatively, one or more processors operating in accordance with stored instructions may implement the functions associated with uniformity tuning in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for improving ion implantation throughput and dose uniformity, the method comprising the steps of:
    measuring an ion beam density distribution in an ion beam;
    calculating an ion dose distribution across a predetermined region of a workpiece that results from a scan velocity profile, wherein the scan velocity profile comprises a first component and a second component that control a relative movement between the ion beam and the workpiece in a first direction and a second direction respectively, wherein the ion dose distribution is based at least in part on the ion beam density distribution, and wherein the first component is a beam scan velocity profile and the second component is a workpiece scan velocity profile;
    selecting a workpiece rotation mode based on whether an ion beam profile in the first direction has a predominantly symmetric or asymmetric component in the first direction;
    adjusting the first component of the scan velocity profile to further enhance the predominantly symmetric or asymmetric component; and
    adjusting, based on the adjusted first component and the selected workpiece rotation mode, the second component of the scan velocity profile to achieve a desired ion dose distribution.

2. The method according to claim 1, wherein the first direction is a beam scan direction.

3. The method according to claim 1, wherein the second direction is a workpiece scan direction.

4. The method according to claim 1, further comprising performing ion implantation according to the adjusted scan velocity profile.

5. The method according to claim 1, wherein the desired ion dose distribution comprises a uniform distribution pattern in the predetermined region.

6. The method according to claim 1, wherein the desired ion dose distribution comprises a radial distribution pattern in the predetermined region.

7. The method according to claim 1, wherein the desired ion dose distribution comprises a distribution pattern in the predetermined region that is configurable to improve device yield based on process variations during ion implantation.

8. The method according to claim 1, wherein the scan velocity profile further comprises a third component that controls one or more rotations of the workpiece to achieve one or more orientations of the workpiece during ion implantation.

9. The method according to claim 8, wherein at least one of the first component and the second component of the scan velocity profile is adjusted after at least one rotation of the workpiece.

10. The method according to claim 8, wherein at least one of the first component and the second component of the scan velocity profile is dynamically adjusted for at least one orientation of the workpiece.

11. The method according to claim 8, wherein the third component comprises the workpiece rotation mode selected from a group consisting of: a single-step mode involving no rotation of the workpiece, a 2-step mode involving two rotations of the workpiece, a quad-mode involving four rotations of the workpiece, and an 8-step mode involving eight rotations of the workpiece.

12. The method according to claim 11, wherein the workpiece rotation mode is selected to improve beam utilization and hence the ion implanter throughput.

13. The method according to claim 1, further comprising:
adjusting an ion beam profile over the predetermined region in the first direction; and
adjusting the second component of the scan velocity profile.

14. The method according to claim 13, wherein the ion beam profile is adjusted by changing a scan distance of the ion beam in at least one of the first direction and the second direction.

15. The method according to claim 13, wherein the ion beam profile is adjusted by changing at least one of the first component and the second component of the scan velocity profile.

16. The method according to claim 13, wherein the ion beam profile is adjusted in at least one of the first direction and the second direction to make the ion beam profile more symmetric with respect to a center of the ion beam profile.

17. The method according to claim 13, wherein the ion beam profile is adjusted in at least one of the first direction and the second direction to make the ion beam profile more asymmetric with respect to a center of the ion beam profile.

18. The method according to claim 1, further comprising:
selecting a 2-step workpiece rotation mode if the ion beam profile has the predominantly symmetric component, wherein the workpiece is rotated by −90° and +90°.

19. The method according to claim 1, further comprising:
selecting a 2-step workpiece rotation mode if the ion beam profile has the predominantly asymmetric component, wherein the workpiece is rotated by 180°.

20. The method according to claim 1, further comprising:
selecting a 4-step workpiece rotation mode if the ion beam profile has the predominantly asymmetric component wherein the workpiece is rotated by 90° in each step.

21. The method according to claim 1, wherein the first direction is perpendicular to the second direction.

22. The method according to claim 1, wherein the ion beam is a ribbon beam, and wherein the ion beam profile in the first direction is adjusted by tuning one or more beamline elements to change a spatial distribution of beamlets within the ribbon beam.

23. The method according to claim 1, wherein the ion beam is a stationary spot beam, and wherein the scan velocity profile causes a 2-D mechanical scan of the workpiece through the stationary spot beam.

24. The method according to claim 23, wherein the first component of the scan velocity profile causes the workpiece to move at a variable speed in the first direction, and wherein the second component of the scan velocity profile comprises a variable scan pitch.

25. At least one processor readable carrier for storing a computer program of instructions configured to be readable by at least one processor for instructing the at least one processor to execute a computer process for performing the method as recited in claim 1.

26. A system for improving ion implantation throughput and dose uniformity, the system comprising:
a processor unit in communication with a scan controller of an ion implanter, wherein the scan controller is configured to cause an ion beam to scan across a predetermined region of a workpiece; and
a measurement interface coupled to the processor unit and the ion implanter;
wherein the processor unit is adapted to:
measure an ion beam density distribution in an ion beam;
calculate an ion dose distribution across a predetermined region of a workpiece that results from a scan velocity profile, wherein the scan velocity profile comprises a first component and a second component that control a relative movement between the ion beam and the workpiece in a first direction and a second direction respectively, wherein the ion dose distribution is based at least in part on the ion beam density distribution, and wherein the first component is a beam scan velocity profile and the second component is a workpiece scan velocity profile; and
select a workpiece rotation mode based on whether an ion beam profile in the first direction has a predominantly symmetric or asymmetric component in the first direction;
adjust the first component of the scan velocity profile to further enhance the predominantly symmetric or asymmetric component; and
adjust, based on the adjusted first component and the selected workpiece rotation mode, the second component of the scan velocity profile to achieve a desired ion dose distribution.

27. The system according to claim 26, wherein the first direction is a beam scan direction.

28. The system according to claim 26, wherein the second direction is a workpiece scan direction.

29. The system according to claim 26, wherein the processor unit is further adapted to perform ion implantation according to the adjusted scan velocity profile.

30. The system according to claim 26, wherein the desired ion dose distribution comprises a uniform distribution pattern in the predetermined region.

31. The system according to claim 26, wherein the desired ion dose distribution comprises a radial distribution pattern in the predetermined region.

32. The system according to claim 26, wherein the desired ion dose distribution comprises a distribution pattern in the predetermined region that is configurable to improve device yield based on process variations during ion implantation.

33. The system according to claim 26, wherein the scan velocity profile further comprises a third component that controls one or more rotations of the workpiece to achieve one or more orientations of the workpiece during ion implantation.

34. The system according to claim 33, wherein at least one of the first component and the second component of the scan velocity profile is adjusted after at least one rotation of the workpiece.

35. The system according to claim 33, wherein at least one of the first component and the second component of the scan velocity profile is dynamically adjusted for at least one orientation of the workpiece.

36. The system according to claim 33, wherein the third component comprises the workpiece rotation mode selected from a group consisting of: a single-step mode involving no rotation of the workpiece, a 2-step mode involving two rotations of the workpiece, a quad-mode involving four rotations of the workpiece, and an 8-step mode involving eight rotations of the workpiece.

37. The system according to claim 36, wherein the workpiece rotation mode is selected to improve beam utilization and hence the ion implanter throughput.

38. The system according to claim 26, wherein the processor unit is further adapted to:
adjust an ion beam profile over the predetermined region in the first direction; and
adjust the second component of the scan velocity profile.

39. The system according to claim 38, wherein the ion beam profile is adjusted by changing a scan distance of the ion beam in at least one of the first direction and the second direction.

40. The system according to claim 38, wherein the ion beam profile is adjusted by changing at least one of the first component and the second component of the scan velocity profile.

41. The system according to claim 38, wherein the ion beam profile is adjusted in at least one of the first direction and the second direction to make the ion beam profile more symmetric with respect to a center of the ion beam profile.

42. The system according to claim 38, wherein the ion beam profile is adjusted in at least one of the first direction and the second direction to make the ion beam profile more asymmetric with respect to a center of the ion beam profile.

43. The system according to claim 26, wherein the processor unit is further adapted to select a 2-step workpiece rotation mode if the ion beam profile has the predominantly symmetric component, wherein the workpiece is rotated by −90° and +90°.

44. The system according to claim 26, wherein the processor unit is further adapted to select a 2-step workpiece rotation mode if the ion beam profile has the predominantly asymmetric component, wherein the workpiece is rotated by 180°.

45. The system according to claim 26, wherein the processor unit is further adapted to select a 4-step workpiece rotation mode if the ion beam profile has the predominantly asymmetric component, wherein the workpiece is rotated by 90° in each step.

46. The system according to claim 26, wherein the first direction is perpendicular to the second direction.

47. The system according to claim 26, wherein the ion beam is a ribbon beam, and wherein the ion beam profile in the first direction is adjusted by tuning one or more beamline elements to change a spatial distribution of beamlets within the ribbon beam.

48. The system according to claim 26, wherein the ion beam is a stationary spot beam, and wherein the scan velocity profile causes a 2-D mechanical scan of the workpiece through the stationary spot beam.

49. The system according to claim 48, wherein the first component of the scan velocity profile causes the workpiece to move at a variable speed in the first direction, and wherein the second component of the scan velocity profile comprises a variable scan pitch.

* * * * *